United States Patent
Manoukian

(10) Patent No.: US 6,561,088 B1
(45) Date of Patent: May 13, 2003

(54) SILK-SCREEN PRINTING MACHINE

(75) Inventor: Haritiun Manoukian, Capiago Intimiano (IT)

(73) Assignee: Argon HT S.r.l., Ospedaletto Lodigiano (IT)

( * ) Notice: Subject to any disclaimer, the term of this patent is extended or adjusted under 35 U.S.C. 154(b) by 0 days.

(21) Appl. No.: 09/980,081

(22) PCT Filed: May 31, 1999

(86) PCT No.: PCT/IT99/00153
§ 371 (c)(1),
(2), (4) Date: Nov. 30, 2001

(87) PCT Pub. No.: WO00/73069
PCT Pub. Date: Dec. 7, 2000

(51) Int. Cl.[7] .......................... B41F 15/00; B41F 15/36; B41L 13/00
(52) U.S. Cl. .................. 101/123; 101/126; 101/114
(58) Field of Search ................. 101/123, 126

(56) References Cited

U.S. PATENT DOCUMENTS

| | | | | |
|---|---|---|---|---|
| 2,207,818 A | * | 7/1940 | Perry et al. | 101/123 |
| 2,612,835 A | * | 10/1952 | Marek et al. | 101/126 |
| 3,026,794 A | * | 3/1962 | Nicholson | 101/123 |
| 3,106,890 A | * | 10/1963 | Schmitt | 101/123 |
| 3,486,441 A | | 12/1969 | Hillman | |
| 3,788,215 A | * | 1/1974 | Lambert | 101/123 |
| 4,216,717 A | | 8/1980 | Hall | |
| 5,970,867 A | * | 10/1999 | Barozzi | 101/126 |

FOREIGN PATENT DOCUMENTS

| | | | | |
|---|---|---|---|---|
| DE | 3111416 | | 10/1982 | |
| GB | 2019318 A | * | 10/1979 | ........... B41F/15/00 |

* cited by examiner

*Primary Examiner*—Andrew H. Hirshfeld
*Assistant Examiner*—Leo T. Hinze
(74) *Attorney, Agent, or Firm*—Millen, White, Zelano & Branigan, P.C.

(57) ABSTRACT

A machine for screen-printing on a flat sheet comprises at least one first mobile frame connected to a support plane for the sheet to be printed and at least one second mobile frame that supports a screen for printing, a doctor, and the members to guide and move the doctor. Pairs of eccentric wheels are provided so as to cyclically move the first and second frames in a direction perpendicular to the support plane between an open position, corresponding to which an already printed sheet is removable and a sheet to be printed is introducible, and a closed position in which the sheet to be printed may be retained on the support plane during the printing phase.

9 Claims, 2 Drawing Sheets

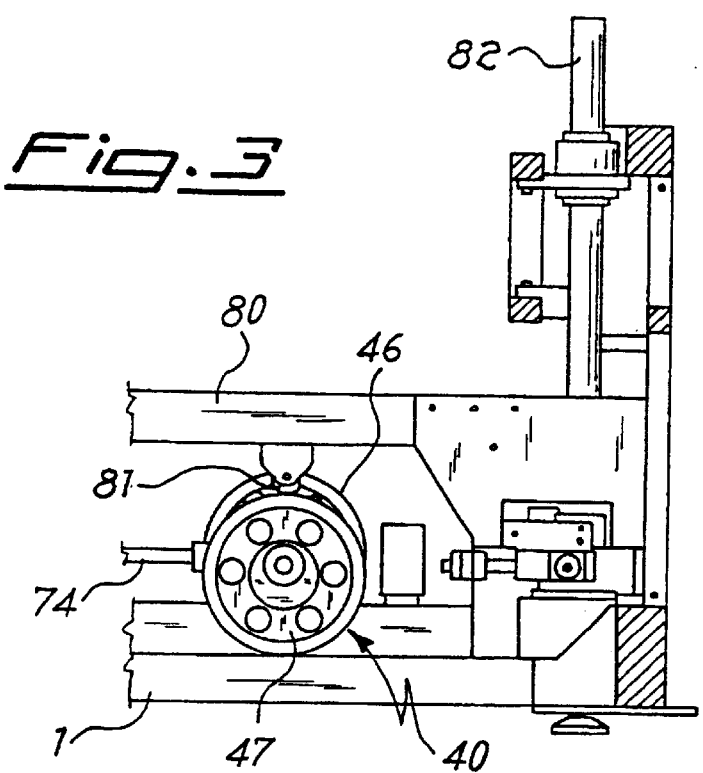
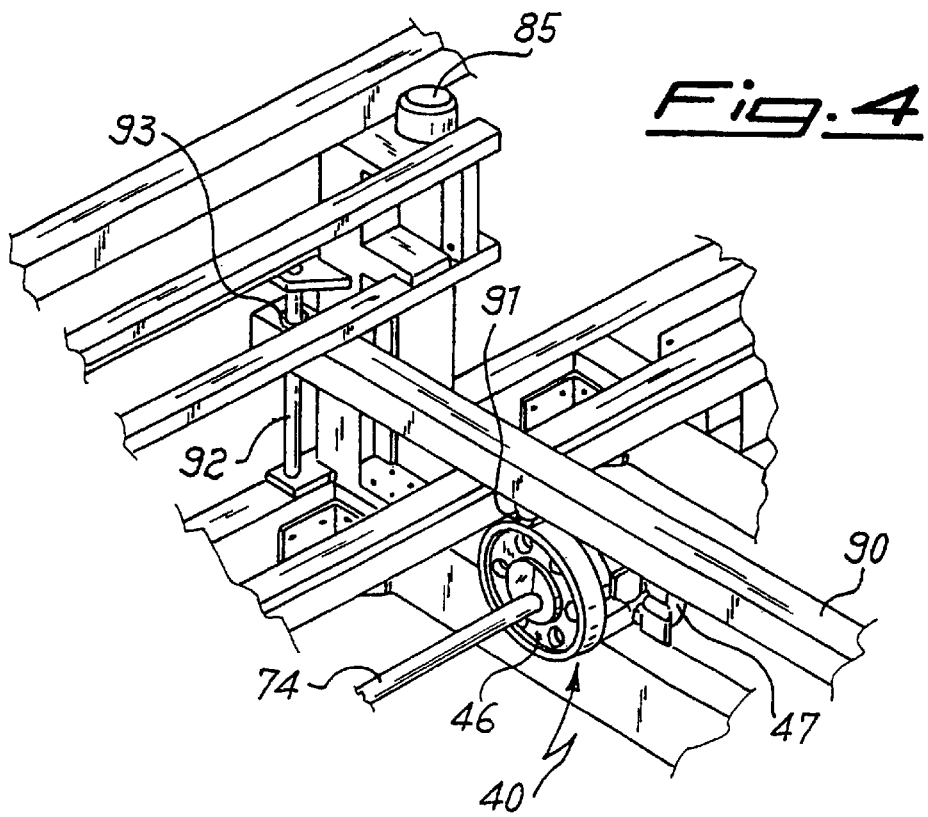

SILK-SCREEN PRINTING MACHINE

TECHNICAL FIELD OF THE INVENTION

The present invention relates to a machine for silk-screen printing on a flat surface, such as for instance a sheet of paper or similar material, or flat surfaces realised with other materials, such as the flat surfaces of printed circuit boards for instance.

BACKGROUND ART

The known type of machines for screen-printing on flat surfaces generally comprise a fixed structure to which is linked in a mobile way a first frame connected to a support plane on which the sheet to be printed is positioned by means of extraction from a feeding station. Also linked to the fixed structure are a second frame which supports a printing screen, and the members to guide and move a printing bridge onto which a doctor is attached.

The printing cycle involves the separation of the support plane from the structure supporting the screen and the printing bridge during the phase of admission of a new sheet to be printed, to allow the means for positioning the sheet to pass between the underlying support plane and the overlying frame that supports the screen and the printing bridge.

As well as machines in which the movement between these two frames is effected "like an opening book," (with the frames hinged in correspondence to the exit side of the printed sheet), machines are known for screen-printing on flat surfaces in which the movement between the two frames occurs along a direction perpendicular to the support plane of the surface to be printed.

To carry out such movements, it is known to use sliders hat run along suitably shaped guides, or cam disks of the "cam nose" type are used to impart the desired movement during each cycle of printing. The principal drawbacks of the known machines is due in particular to the fact that the systems adopted for the movement of the frames are particularly complex and subject to wear. For this reason the frequent adjustment operations, necessary to compensate for the wear to which the parts are subject, require particularly long intervention time and machine downtimes.

PURPOSES OF THE INVENTION

A purpose of the present invention is to propose a machine for screen-printing on a flat surface that considerably reduces the adjusting interventions to maintain the synchronisation between the various mobile parts.

Another purpose of the present invention is to propose a machine of the type mentioned above that particularly simplifies interventions for maintenance and for adjusting the mobile parts.

A further purpose of the present invention is to propose a simple machine for screen-printing on flat surfaces in which the movement of the frames can be achieved at particularly reduced cost.

DISCLOSURE OF THE INVENTION

These purposes are achieved by the present invention, which relates to a machine for screen-printing on a flat surface, of the type comprising a fixed structure, at least a first mobile frame linked to a support plane for the sheet to be printed, and at least a second mobile frame which carries a printing screen and the members to guide a move a doctor, characterised by comprising means for cyclically moving the first and second frames in a direction perpendicular to the support plane between an open position, in which the sheet just printed is removed and a blank to be printed is inserted, and a closed position in which the sheet to be printed is maintained on the support plane during the printing phase, characterised in that the means for cyclically moving the first and second frames comprise a plurality of pairs of eccentric wheels rotatably fitted to the fixed structure and respective follower rollers fitted to the first and second frames. The use of eccentric wheels instead of the traditional cams gives a more regular motion to the frames and limits the inertia which they develop, even at particularly high working speeds.

Furthermore, eccentric wheels are simpler and undoubtedly less expensive to be produced than the cams used in the machines of the known type.

Each pair of eccentric wheels is driven by a common shaft with one wheel out of phase with respect to the other by around 180°. Each pair of eccentric wheels comprises a first wheel acting on at least one follower roller fixed to the first frame and a second wheel acting on at least one follower roller fixed to the second frame.

The aforementioned frames are substantially rectangular in plan. The first frame preferably is slightly smaller than the second frame and is mobile inside the space delimited by the second frame. Four pairs of eccentric wheels are therefore located substantially in correspondence of the angles of the first and of the second frame to get a particularly precise and balanced movement of the frames.

According to a particularly advantageous aspect, the eccentric wheels are rotated by a common motor through transmission driving means. This motor is separate from the motors that operate the other mobile members in such a way as to allow the application of computerised numerical control devices to synchronise the movements of the two frames with respect to other mobile members of the machine, such as for instance the doctor and the means for positioning the sheets with respect to the support plane. Furthermore, the means for transmission of the motion between the motor for the movement of the frames comprise a plurality of shafts and one or more drive distribution boxes. This allows the drive system of the eccentric wheels to be installed at particularly reduced costs in printing machines of different dimensions. In fact, it is sufficient only to vary the length of the motion transmission shafts, while maintaining unchanged the drive distribution boxes and the bearing fixing the pairs of eccentric wheels to the fixed structure of the machine.

To get a high precision movement of the frames with respect to fixed structure, a plurality of vertical guide elements, integral to the fixed structure, are preferably provided.

BRIEF DESCRIPTION OF DRAWINGS

Further advantages and characteristics of the present invention will be more evident from the description that follows, made by way of example and with not limiting purpose, with particular reference to the attached drawings, in which:

FIG. 3 is an elevation view of a detail of the means for guiding the frame connected with the printing bridge; and FIG. 4 is a perspective view of a detail of the means for guiding the frame connected with the printing plane.

BEST MODE FOR CARRYING OUT THE INVENTION

Figure 1:
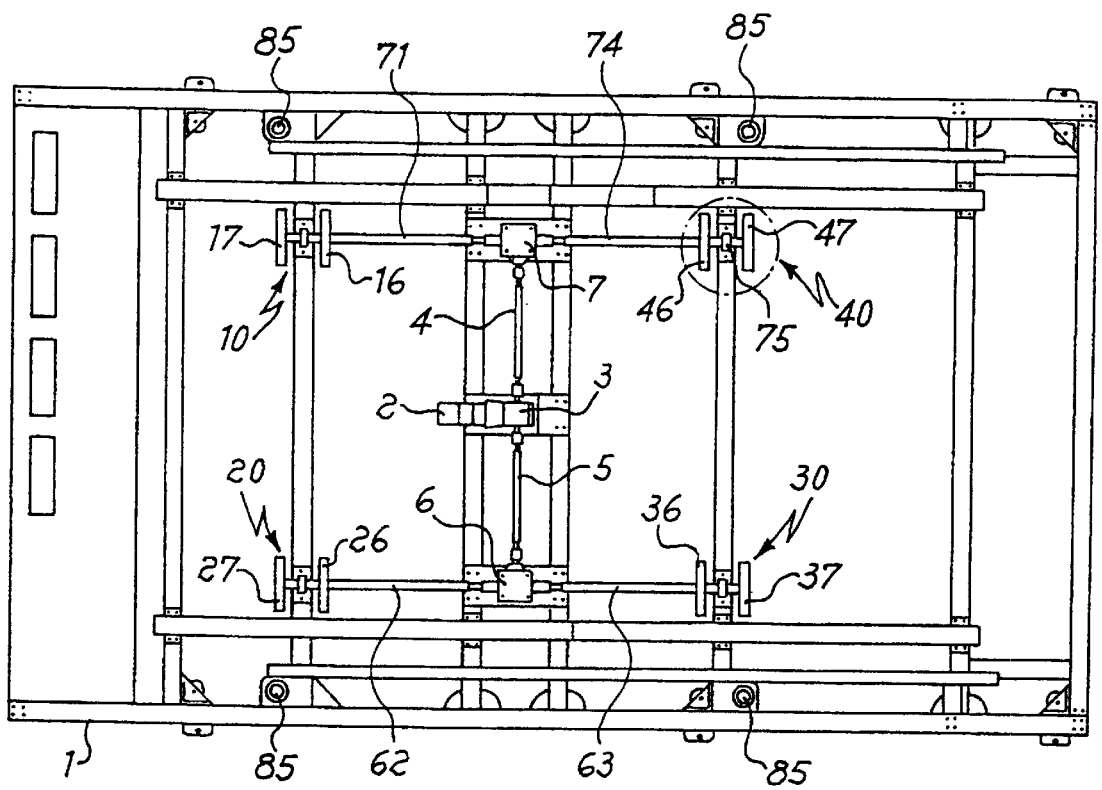
FIG. 1 is a plan view of some elements of the machine according to the invention.

FIG. 1 shows a plan view of the fixed structure 1 of a machine for screen-printing according to the present invention and of the system of movement of the frames (not shown for reasons of simplification) integral respectively with the frame connected to the support plane and to the printing bridge (also not shown).

On the fixed structure 1 is mounted the system of movement according to the present invention, comprising four pairs of eccentric wheels 10, 20, 30 and 40 which will be described in more detail below with reference to the pair of wheels 40 shown with a magnified view in FIG. 2.

The movement is supplied by a motor 2 and from a first motion distribution box 3 to a pair of shafts 4 and 5, exiting from opposite sides of the box 3 respectively. The shaft 5 is connected to a second distribution box 6 that distributes the motion to the pairs of eccentric wheels 20 and 30 by means of shafts 62 and 63 respectively. The shaft 4 exiting from the box 3 is in turn connected to a box 7 that distributes the motion to the pairs of wheels 10 and 40 by means of shafts 71 and 74 respectively.

Figure 2:
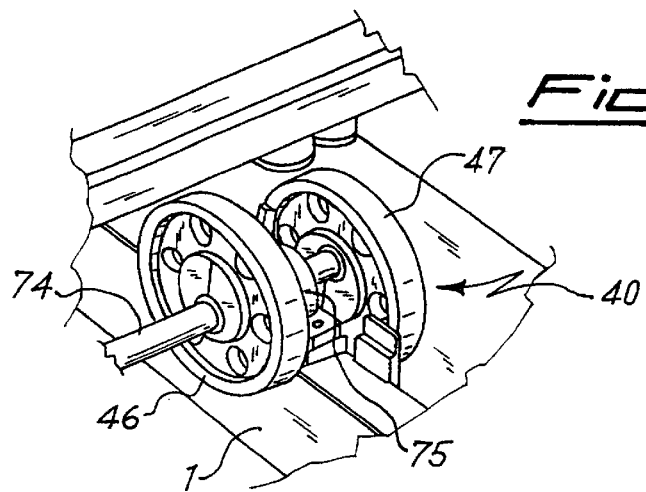
FIG. 2 is a perspective view a detail of a pair of eccentric wheels used in the machine according to the present invention.

With reference to the detailed view of FIG. 2, the pair of eccentric wheels 40 comprises a first wheel 46 and a second wheel 47 keyed on to the same shaft 74 with phase displacement preferably equal to around 180°. The shaft 74 is supported by a bearing 75 fitted to the fixed structure 1.

It is clear that the system of drive transmission with eccentric wheels can easily be adapted for machines having different dimensions simply by changing the length of the shafts 4, 5, 62, 63, 71 and 74.

With a phase displacement of 180°, there can be achieved the simultaneous separation and approach of the two frames moved by the wheels 46 and 47. But, if necessary, the phase displacement between the two wheels can also be slightly advanced or retarded (within about 5°), for instance in the case where a slightly different sequence from that indicated as preferred is required.

What has been illustrated for the pair 40 of eccentric wheels 46 and 47 also applies to the remaining pairs of eccentric wheels, i.e. the pair 10 comprising the eccentric wheels 16 and 17, the pair 20 comprising the wheels 26 and 27, and the pair 30 comprising the wheels 36 and 37.

With further reference to FIG. 1, it should be noted that the pairs of wheels 10, 20, 30 and 40 are arranged substantially in correspondence of the angles of a rectangle. In particular, the wheels 16, 26, 36 and 46, which are more internal within this configuration, are all in phase to each other and act on the first frame (not shown in FIG. 1) to which is connected the support plane for a sheet to printed. The wheels 17, 27, 37 and 47, which are more external within this configuration, are also all in phase to each other, but out of phase with respect to the preceding wheels, and act on a second frame connected to the structure for supporting the printing screen and to the system for moving the printing bridge and the doctor attached to it.

This configuration is determined by the fact that both the frames are substantially rectangular in plan view. In particular, the first frame connected with the support plane of the sheet to be printed is slightly smaller with respect to the frame connected with the system for supporting the screen and for moving the printing bridge.

Some elements of these frames are shown in FIGS. 3 and 4, in which details of the means for guiding the frames are illustrated. In particular, FIG. 3 shows an element 80 of the second frame, i.e. the frame which is connected to the system for supporting the screen and for moving the printing bridge. The element 80 of the second frame comprises a follower roller 81 that rotates on the eccentric wheel 47 of the pair 40. A bar 82 which is inserted in suitable bushes (not shown) integral with the element 80 that define a through vertical hole in it as the means for guiding the element 80 of the second frame. The machine provides for four vertical bars 82 inserted in suitable housings 85 visible in FIGS. 1 and 4.

FIG. 4 shows an element 90 of the first frame, i.e. that connected to the support plane for the sheet to be printed. To the element of frame 90 is connected a follower roller 91 that rotates on the eccentric wheel 46 of the pair 40 of eccentric wheels 46 and 47. A bar 92 is inserted in a through hole provided with suitable bushes 93 that facilitate the sliding of the element 90 of the first frame to ensure the guiding of the same element 90 of the firs frame. Further bars 93, not shown in the other figures, are provided in proximity of each housing 85 and of each of the remaining pairs 10, 20 and 30 of eccentric wheels.

The synchronisation between the cycles produced by the pairs of eccentric wheels 10, 20, 30 and 40 and the remaining mobile members, such as the sheet handling devices operated by motors different from the motor 2 for instance, is generally guaranteed by computerised numerical control means.

What is claimed is:

1. Machine for screen-printing on a flat sheet, the machine comprising a fixed structure, at least a first mobile frame linked to a support plane for the flat sheet to be printed, and at least a second mobile frame which carries a printing screen, a doctor, and the members to guide and move the doctor, as well as means for cyclically moving said first and second frames in a direction perpendicular to said support plane between an open position, in which the sheet just printed is removable and a sheet to be printed is insertable, and a closed position in which said sheet to be printed is maintained on said support plane during the printing phase, characterised in that said means for cyclically moving said first and second frames comprise a plurality of pairs of eccentric wheels rotatably fitted to said fixed structure and respective follower rollers fitted to said first and second frames.

2. A machine according to claim 1, characterised in that each pair of said eccentric wheels is driven from a common shaft with one wheel out of phase with respect to the other.

3. A machine according to claim 1, characterised in that each pair of said eccentric wheels has a first wheel acting on at least one of said follower rollers fixed to said first frame and a second wheel acting on at least one of said follower rollers fixed to said second frame.

4. A machine according to claim 1, characterised in that said first and second frames are substantially rectangular in plan and that said first frame is slightly smaller than said second frame and is mobile inside the space delimited by said second frame.

5. A machine according to claim 1, said plurality of pairs of eccentric wheels comprising four pairs of eccentric wheels located substantially in correspondence with corners of said first and second frames.

6. A machine according to claim 1, characterised in that said eccentric wheels are driven in rotation by a common motor through means for transmission of the rotation.

7. A machine according to claim 6, charactersied in that said means for transmission of the rotation comprise a plurality of shafts and one or more movement distribution boxes.

8. A machine according to claim 6, characterized by comprising means of computerized numerical control to synchronize the rotation of said motor with other mobile members of the machine.

9. A machine according to claim 1, characterised by comprising a plurality of vertical guiding elements integral with said fixed structure for guiding the movement in vertical direction of said first and second frames.

* * * * *